United States Patent
Hill

(10) Patent No.: US 6,236,585 B1
(45) Date of Patent: May 22, 2001

(54) DYNAMIC, DATA-PRECHARGED, VARIABLE-ENTRY-LENGTH, CONTENT ADDRESSABLE MEMORY CIRCUIT ARCHITECTURE WITH MULTIPLE TRANSISTOR THRESHOLD VOLTAGE EXTENSIONS

(75) Inventor: Anthony M. Hill, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/307,699

(22) Filed: May 10, 1999

Related U.S. Application Data

(60) Provisional application No. 60/085,274, filed on May 13, 1998.

(51) Int. Cl.$^7$ .................................................. G11C 13/00
(52) U.S. Cl. ................ 365/49; 365/189.05; 365/189.07; 365/203; 365/204; 711/108; 711/128
(58) Field of Search ..................................... 711/108, 128; 365/49, 189.05, 189.07, 203, 204

(56) References Cited

U.S. PATENT DOCUMENTS

| | | | |
|---|---|---|---|
| 4,862,412 | * | 8/1989 | Fried et al. .............................. 365/49 |
| 5,325,501 | * | 6/1994 | Carlstedt ................................. 365/49 |
| 5,351,208 | * | 9/1994 | Jiang ....................................... 365/49 |
| 5,453,948 | * | 9/1995 | Yoneda ................................... 365/49 |
| 5,469,378 | * | 11/1995 | Albon et al. ........................... 365/49 |
| 5,598,115 | * | 1/1997 | Holst ..................................... 326/119 |
| 5,646,878 | * | 7/1997 | Samra .................................... 365/49 |
| 5,699,288 | * | 12/1997 | Kim et al. .............................. 365/49 |
| 5,754,463 | * | 5/1998 | Henstrom et al. ...................... 365/49 |
| 5,999,434 | * | 12/1999 | Yoneda et al. ......................... 365/49 |
| 6,044,005 | * | 3/2000 | Gibson et al. ......................... 365/49 |
| 6,061,262 | * | 5/2000 | Schultz et al. ......................... 365/49 |

OTHER PUBLICATIONS

Zukowski, Charles, et al.; Use of Selective Precharge for Low–Power on the Match Lines of Content–Addressable Memories, Integration—The VLSI Journal, vol. 23, No. 2, Nov., 1997, pp. 64–68.

Schultz, Kenneth; Content–Addressable Memory Core Cells—A Survey, Integration—The VLSI Journal, vol. 23, No. 2, Nov., 1997, pp. 171–188.

* cited by examiner

*Primary Examiner*—Do Hyun Yoo
*Assistant Examiner*—Hong Kim
(74) *Attorney, Agent, or Firm*—Robert D. Marshall, Jr.; W. James Brady, III; Frederick J. Telecky, Jr.

(57) ABSTRACT

A dynamic, data-precharged, variable-entry-length content addressable memory circuit architecture. A match at a particular data bit is found employing precharge/conditional discharge domino logic. Two bits stored at each entry location, data bit and valid bit. The valid bit determines whether the corresponding data bit takes part in the match determination. This allows for full flexibility in the matching function including variable-entry-length access. The precharge is data driven. This eliminates clock signal routing to the memory array, reducing crosstalk between clock and data lines and reducing routing congestion. The circuit employs a mix of low threshold voltage and high threshold voltage transistors. The selection of which transistors have low threshold voltage and which have high threshold voltage enables additional speed via low threshold voltage transistors while maintaining low quiescent current via high threshold voltage transistors.

9 Claims, 4 Drawing Sheets

DYNAMIC, DATA-PRECHARGED, VARIABLE-ENTRY-LENGTH, CONTENT ADDRESSABLE MEMORY CIRCUIT ARCHITECTURE WITH MULTIPLE TRANSISTOR THRESHOLD VOLTAGE EXTENSIONS

This application claims benefit of Provisional No. 60/085,274 filed May 13, 1998.

TECHNICAL FIELD OF THE INVENTION

The technical field of this invention is circuits for addressing content addressable memories.

BACKGROUND OF THE INVENTION

This invention relates to a content addressable memory circuit architecture with unique features. Content addressable memories are referred to as CAMs for brevity and are widely used in conjunction with cache RAM to provide additional features in high performance memories found in present day microprocessors. CAM functional elements are typically loaded with special words representing address, data, or instructions, entries for which the processor might need to do a later search or identity comparison.

The data stored in CAMs are accessed based on their contents, rather than their address. This functionality is useful in many applications, including databases, table look-up, and associative computing. Particularly, the processor might need to know if any special words previously stored in a CAM is identical to a word which the processor holds under consideration for a processor decision. One specific example of CAM usage would be address-protection applications. While CAM functions normally test for completely identical words (words identical in every bit position) it is desirable in address protection applications to have a variable-entry-length feature. This relates to the structure of the CAM as follows. Content addressable memories which have only the completely-identical-word test feature use a single valid-bit storage latch per word location. One digital state of this bit signifies that the word was written by the processor on a previous processor operation and that the entire word qualifies for the identity check.

SUMMARY OF THE INVENTION

The content addressable memories of this invention have a variable-entry-length test feature having two bits stored in all locations, one bit of the entry word, and one valid bit. Each entry bit of these locations in the CAM can hold data which can be labeled valid when the valid bit is set "high" or "invalid" when the valid bit is set "low". Thus, as an example, a 32-bit address, stored in one CAM word location can be tested for identical content at, say only 6 bit locations, rather than all 32 bit locations by merely setting the companion valid bits "high" at the desired 6 locations and "low" at all other locations. This enables the computer operating system to allocate variable-size memory ranges for different processes, which results in improved application performance.

One object of this invention is to provide an improved CAM circuit architecture which allows an entry, including a data bit plus a valid bit, to be stored at each bit entry location of each CAM word. This allows realization of variable entry-length of any length.

Another object of this invention is to provide for the use of completely dynamic evaluation logic, which gives enhanced performance.

Another object of this invention is to improve performance of the dynamic evaluation logic further by employing low $V_T$ transistors (LVT) in speed-critical areas of the circuit, while providing protection against additional leakage current flow which could result if such devices were used indiscriminately.

Yet another object of this invention is to precharge the dynamic gate in the CAM cell with data, thus eliminating the distribution of a clock signal inside the CAM. This helps to alleviate crosstalk and noise problems and reduces circuit routing congestion.

These and other objects are accomplished in accordance with the present invention in which a CAM cell having both a data latch and a valid latch. These latches have dual rail input data (sdata and $\overline{\text{sdata}}$) and dual rail input valid (svalid and $\overline{\text{svalid}}$) signals. The CAM cell also has input from WE (write enable) and dual rail dynamic inputs addr and $\overline{\text{addr}}$ which supply an address, or match word, to the word under consideration.

When a particular word is addressed with the dual rail dynamic address signals, addr and $\overline{\text{addr}}$ becoming active, a $\text{match}_i$ signal is generated which signifies a match if $\text{match}_i$ is "high" or no match if $\text{match}_i$ is "low".

In the circuit configuration provided by the present invention, the addr and $\overline{\text{addr}}$ signals are applied to the CAM cell in such a way that allows for the use of low $V_T$ (LVT) transistors in the speed critical portion of the circuit.

In addition the combination of dynamic logic with attendant significant reduction in circuit capacitance, and low $V_T$ transistors with attendant faster turn-on time and higher drive current together provide the optimum circuit performance.

By precharging the address lines, addr and $\overline{\text{addr}}$, to a "low" state, clock distribution within the CAM array can be eliminated. This significantly simplifies circuit routing and also results in lower crosstalk and noise.

Including both the data latch and the valid latch in each CAM entry location provides for variable-entry-length and attendant improved system performance.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
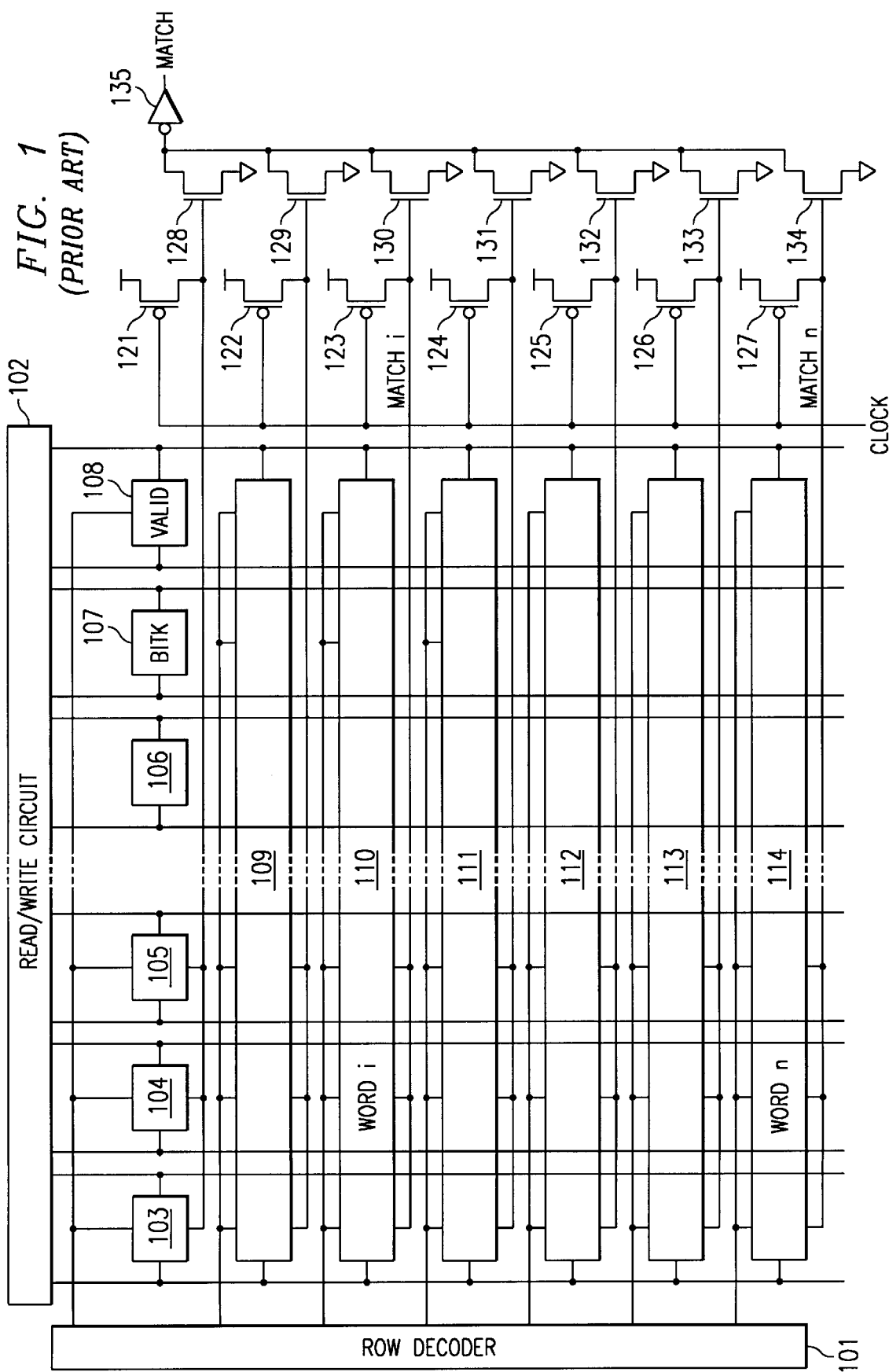
FIG. 1 illustrates a typical high-level content addressable memory (CAM) architecture according to the prior art.

Referring to the drawings, in particular, FIG. 1, we have illustrated the high level architecture of a typical CAM as known in the art. The ROW decoder 101 allows for specific entry words to be addressed during WRITE operations. Data can be presented for the WRITE operation and can be retrieved in a READ operation through a conventional READ/WRITE circuit block 102. The array word$_0$ having k-bits is illustrated by bit storage latches 103 through 107 and the valid bit latch is illustrated by latch 108. Each of the boxes contain only one latch. The n-words of the array from word$_1$ through word$_n$ are depicted by blocks 109 through 114.

The valid bit latch 108 relates to all the latches that make up a full word, latches 103 through 107. There is one valid latch for each word. In this example, when valid is set "high" for a particular word, it signifies that a real entry and not a random bit pattern is present. The outputs, labeled match$_n$, the signals at the gates of N-channel transistors 128 through 134, can be examined to determine in which word a match has occurred or the match signal at the output of inverter 135 can be examined to reveal if there is at least one match at any of the word locations.

Figure 2A:
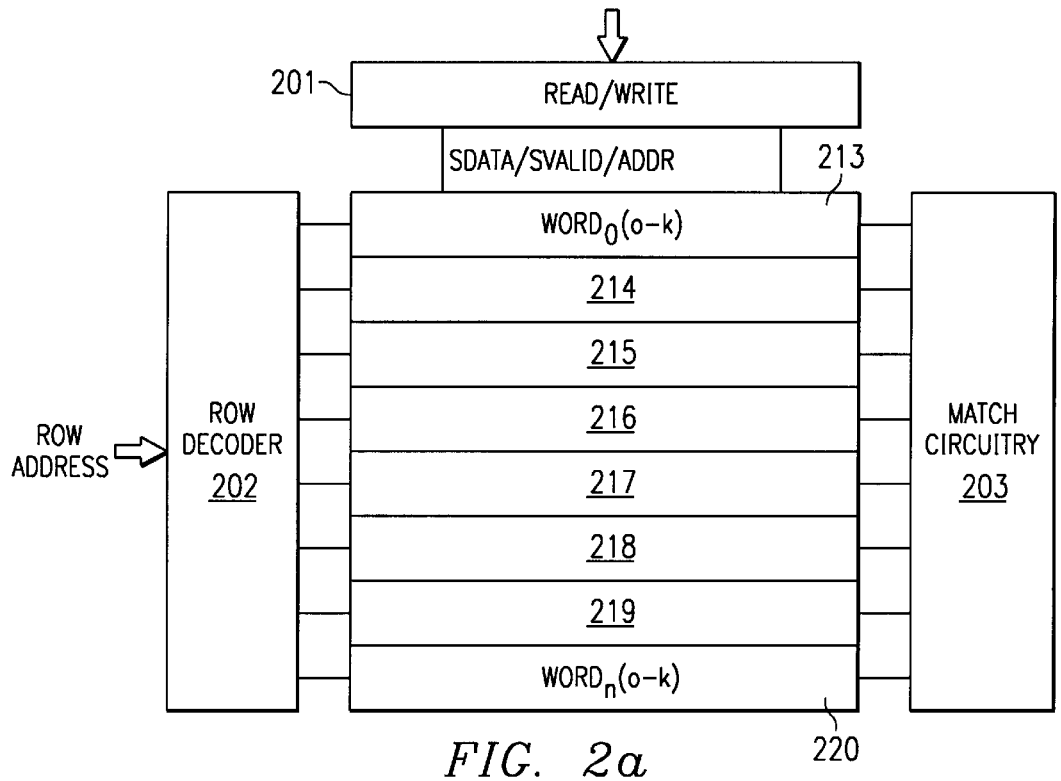
FIG. 2a illustrates a CAM architecture with data and valid bits stored in each location.

FIG. 2*a* illustrates the high level architecture of the CAM of this invention. Each entry bit location contains two latches, data and valid. As each word is written, bits will also be written into the valid latches. In this example, at each entry bit location, if the valid bit set "high" it qualifies the corresponding data bit for a match evaluation. Conversely if valid bit is set "low" the corresponding data bit is ignored during the match evaluation. In FIG. 2*a*, the READ/WRITE function 201 includes driver circuitry to interface bits of sdata, svalid, and addr (the incoming word-to-be-evaluated for a match) signals to the array (words 0 through n, represented by blocks 213 through 220). Row decoder block 202 provides a means of addressing one word on a given clock cycle, thereby directing the word sbit (0 through k) or the word svalid (0 through k) to be written or read.

The match circuitry, block 203, develops the desired output logic, which, for example could be: (1) a match somewhere in the array, (2) no match anywhere in the array, or (3) a match with a specific word in the array.

Figure 2B:
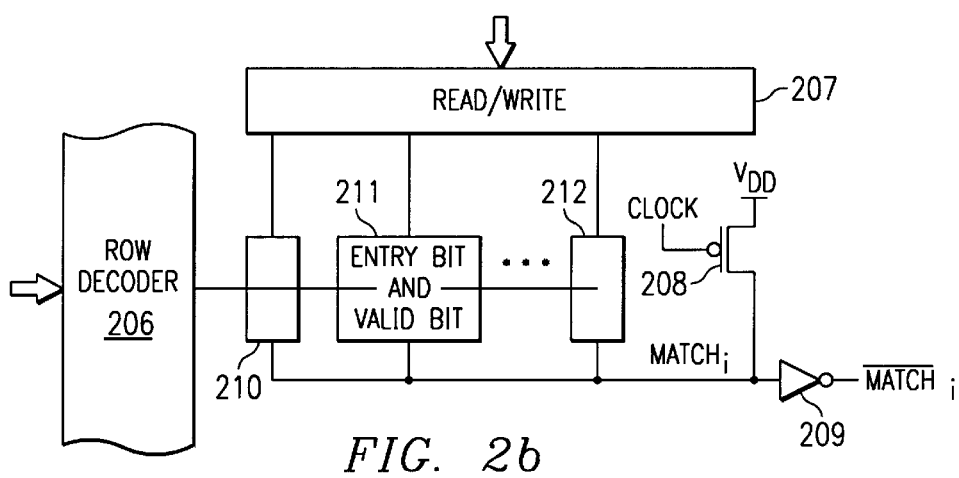
FIG. 2b illustrates the CAM architecture of a typical single entry.

FIG. 2*b* illustrates a single word entry of length n. The evaluation circuitry presented in this invention is distributed among the k CAM cells 210 through 212, each forming an entry bit block. As described earlier, ROW decoding is performed by block 206. P-channel transistor 208 precharges the match$_i$ node at the input of inverter 209.

The signal match$_i$ is generated by the inverter 209. Simultaneously, the addr and $\overline{\text{addr}}$ signals are also precharged "low". This causes the dynamic gates of each CAM cell to precharge as well. Note, this precharge functionality, which is essential to the operation of the CAM, does not require clock distribution throughout the CAM. This saves on valuable routing resources, reduces loading on the clock, and helps to prevent crosstalk between a distributed clock signal and any data signals.

Figure 3:
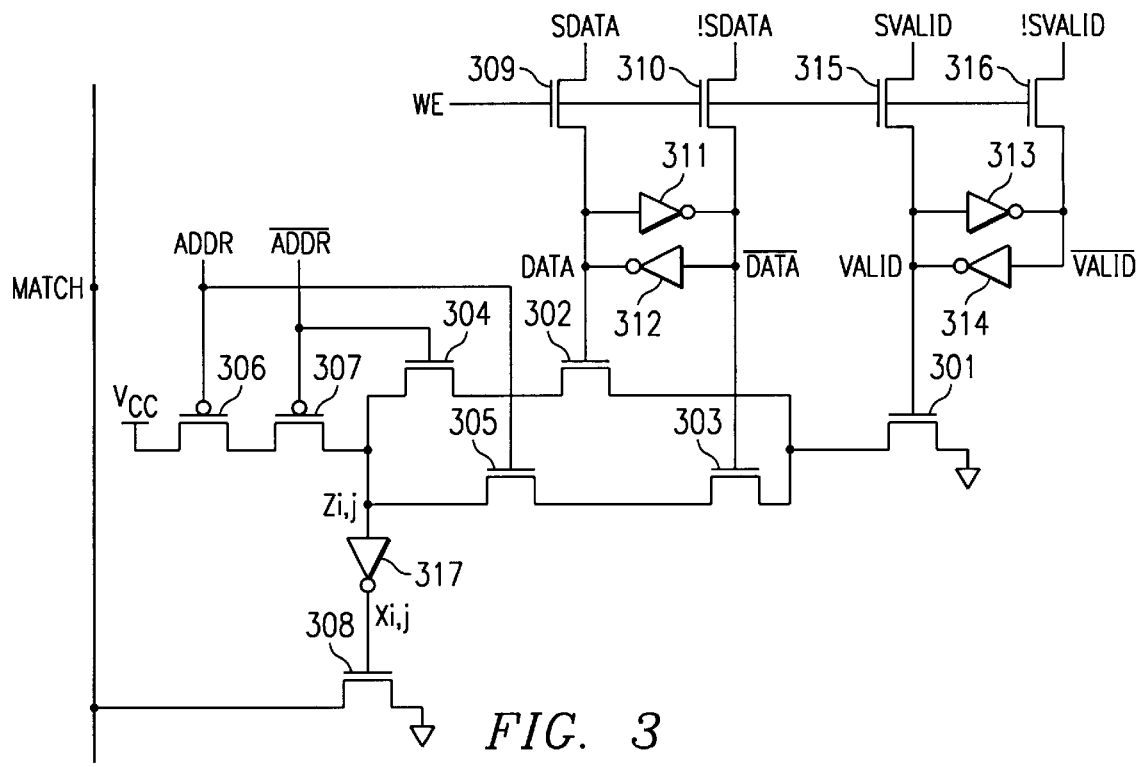
FIG. 3 illustrates a CAM cell with data and valid latches and high performance match evaluation circuit.

FIG. 3 illustrates the proposed CAM cell, showing two storage latches. The first latch, consisting of inverters 311 and 312, stores the data bit. This first latch receives the dual rail, sdata and $\overline{\text{sdata}}$ inputs via the source-drain paths of N-channel transistors 309 and 310. The second latch, consisting of inverters 313 and 314, stores the valid bit. This second latch receives the dual rail, svalid and $\overline{\text{svalid}}$ inputs via the source-drain paths of N-channel transistors 315 and 316. The transistors 309, 310, 315, and 316 receive a word enable signal WE at their gates. This word enable signal enables operation of an entire row, such as one of the rows 213 to 220 illustrated in FIG. 2*a*. The dynamic dual rail precharged addr and $\overline{\text{addr}}$ lines, supplied to gates of 306 and 307 respectively, provide addressing for the match circuitry.

Referring to FIG. 3, note the following. First, the addressing for WRITE and READ, through the ROW DECODER is similar to FIG. 2*a*. This decoder produces the word enable WE signal at the gates of transistors 309, 310, 315, and 316. During a WRITE operation, circuits not shown drive the dual rail lines sdata and $\overline{\text{sdata}}$, setting the state of the latch consisting of inverters 311 and 312 and the dual rail lines svalid and $\overline{\text{svalid}}$, setting the state of the latch consisting of inverters 313 and 314. During a READ operation the state of the dual rail lines sdata and $\overline{\text{sdata}}$ and svalid and $\overline{\text{svalid}}$ are sensed by circuits not shown to determine the respective state of their respective latches.

The storage portion of the CAM cell is not detailed in FIG. 3, but includes a static RAM cell (latches) for data, inverters 311 and 312 and another for valid, inverters 313 and 314. These latches were shown as boxes in FIG. 2*b*.

The unique portion of the CAM cell circuit is the evaluation logic. In a first embodiment, N-channel transistors 301, 302 and 303 are low $V_T$ transistors. FIG. 3 illustrates low $V_T$ transistors by a broad gate stripe. N-channel transistors 304 and 305 are normal (or high) $V_T$ transistors and P-channel transistors 306 and 307 are normal (or high) $V_T$ transistors.

Figure 4:
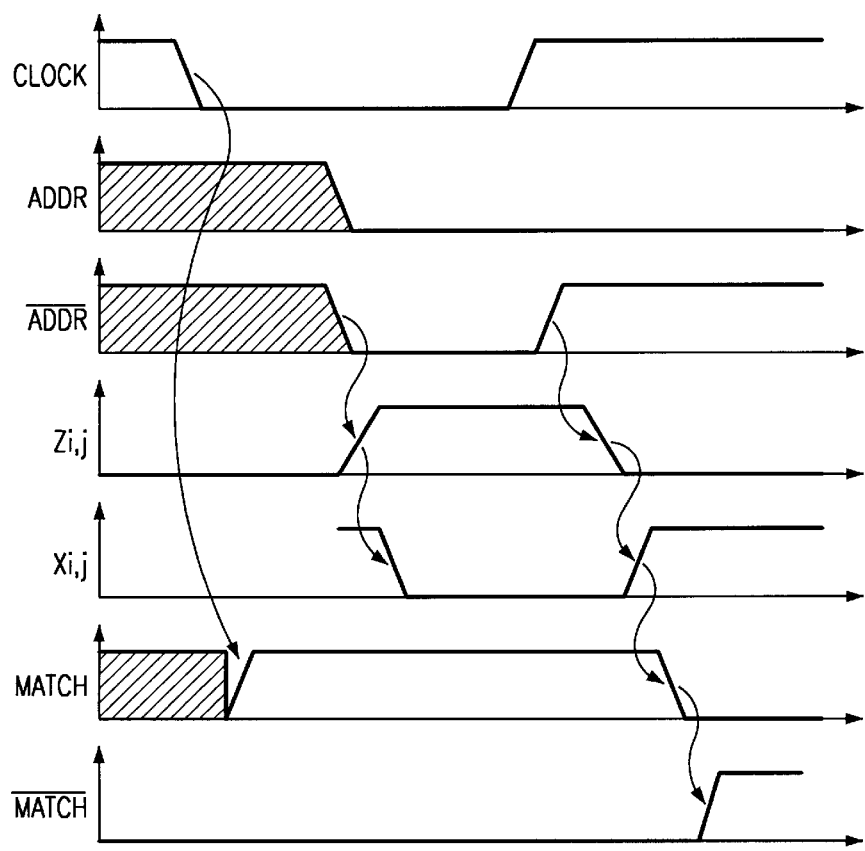
FIG. 4 illustrates descriptive waveforms depicting circuit operation of a CAM high performance match evaluation circuit.

FIG. 4 shows the timing waveforms for a CAM access. A clock signal, not illustrated in FIG. 3 (see FIG. 5), controls the match process. The clock signal causes the match nodes $z_{i,j}$ to precharge by way of the P-channel transistors 306 and 307 shown in FIG. 3. This occurs by simultaneously driving both the addr and $\overline{\text{addr}}$ signals "low" as shown following the cross-hatched portion of the waveforms. These addr and $\overline{\text{addr}}$ signals at the gates of respective P-channel transistors 306 and 307 turn on both these transistors, thus precharging match node $z_{i,j}$. These addr and $\overline{\text{addr}}$ signals are also supplied to the gates of N-channel transistors 304 and 305 cutting them "off". This precharging of $z_{i,j}$, which is essential to the operation of the CAM, does not require clock distribution throughout the CAM. This precharging is achieved via the addr and $\overline{\text{addr}}$ signals only. This saves on valuable routing resources, reduces loading on the clock, and helps to prevent crosstalk between a distributed clock signal and any data signals.

Referring again to FIG. 4, once the clock signal rises, the CAM enters the evaluation phase. At this point either addr signal or the addr signal will go "high". Indeed these inputs are constrained to do so by dual rail dynamic signals, therefore giving the certainty that one, and only one will go "high". Refer again to FIG. 3 for circuit operation details. When either addr or $\overline{\text{addr}}$ goes "high", the precharge path is cut "off" and the evaluation tree of each CAM cell becomes active.

Case 1: valid "high"

If the valid bit valid(i,j), which is the valid bit for word i and entry j, is "high", then the circuit evaluates this word/bit position for a match. If the presented address bit j does not match the contents on the CAM bit in word i and entry j, namely data(i,j) then the node $z_{i,j}$ at the input of inverter 317 will be pulled down "low". Consequently $x_{i,j}$ at the gate of N-channel transistor 308 will then rise. The N-channel transistor 308, whose drain is attached to match$_i$ will be turned "on" and will pull the match$_i$ signal "low" indicating a non-match condition. This in turn will drive $\overline{\text{match}}$ high.

Note that if addr is "high" and data (output of inverter 312) is "high", N-channel transistors 302 and 305 are turned "on" but N-channel transistors 304 and 303 are turned "off". Conversely if addr is "low" and data (output of inverter 312) is "low", then N-channel transistors 304 and 303 are turned "on" and N-channel transistors 302 and 305 are turned "off".

Thus no discharge path exists to discharge node $z_{i,j}$. A match condition in either case results in node $z_{i,j}$ remaining "high".

Mismatch results in either (A) N-channel transistors 301, 302 and 304 all turned "on" if $\overline{addr}$ is "high" and data is "high" or (B) N-channel transistors 301, 303 and 305 all turned "on" if addr is "high" and $\overline{sdata}$ is "high". In either case a discharge path exists to discharge node $z_{i,j}$ to ground. Thus a mismatch condition results in node $z_{i,j}$ being discharged to "low".

Case 2: valid "low"

If svalid(i,j), which is the svalid bit for word i and bit j, is set "low", the circuit ignores this word/bit position for a match. Note that N-channel transistor 301 is "off" and no discharge path to ground exists. Even if the presented address bit j does not match the contents on the CAM bit in word i and entry j, namely data(i,j), then the node $z_{i,j}$ at the input of inverter 317 will still remain "high". Consequently $x_{i,j}$ at the gate of N-channel transistor 308 will then remain "low". The N-channel transistor 308, whose drain is attached to match$_j$, will remain "off" and a default match condition will be indicated. This has the effect of ignoring possible mismatches at this bit position of this entry word. Note that if addr is "high" and data is "high", transistors 302 and 305 are turned "on" and N-channel transistors 304 and 303 are turned "off". Conversely if addr is "low" and data is "low", then N-channel transistors 304 and 303 are turned "on" and N-channel transistors 302 and 305 are turned "off". In either case, however, N-channel transistor 301 is "off" because valid is "low". The default match condition, in either case, results in node $z_{i,j}$ remaining "high".

In the proposed CAM cell, low $V_T$ devices can be used to realize a speed improvement of approximately 5%. In FIG. 3, these optionally low $V_T$ devices have been designated with the thick body stripe. As shown in FIG. 3, N-channel transistors 302 and 303 are low $V_T$ devices and N-channel transistors 304 and 305 are normal (or high) $V_T$ devices, Alternately, N-channel transistors 304 and 305 could be low $V_T$ devices and N-channel transistors 302 and 303 could be normal (or high) $V_T$ devices. As yet another alternative, N-channel transistor 301 could be a low $V_T$ device and N-channel transistors 302, 303, 304, and 305 could be normal (or high) $V_T$ devices. The essential feature is that any potential discharge path include at least one normal $V_T$ transistor. In all of these alternative implementations, the normal $V_T$ transistor(s) provide the ability to withstand the impressed voltage while biased "off" without resulting in increased leakage (quiescent) current from the low $V_T$ devices.

Figure 5:
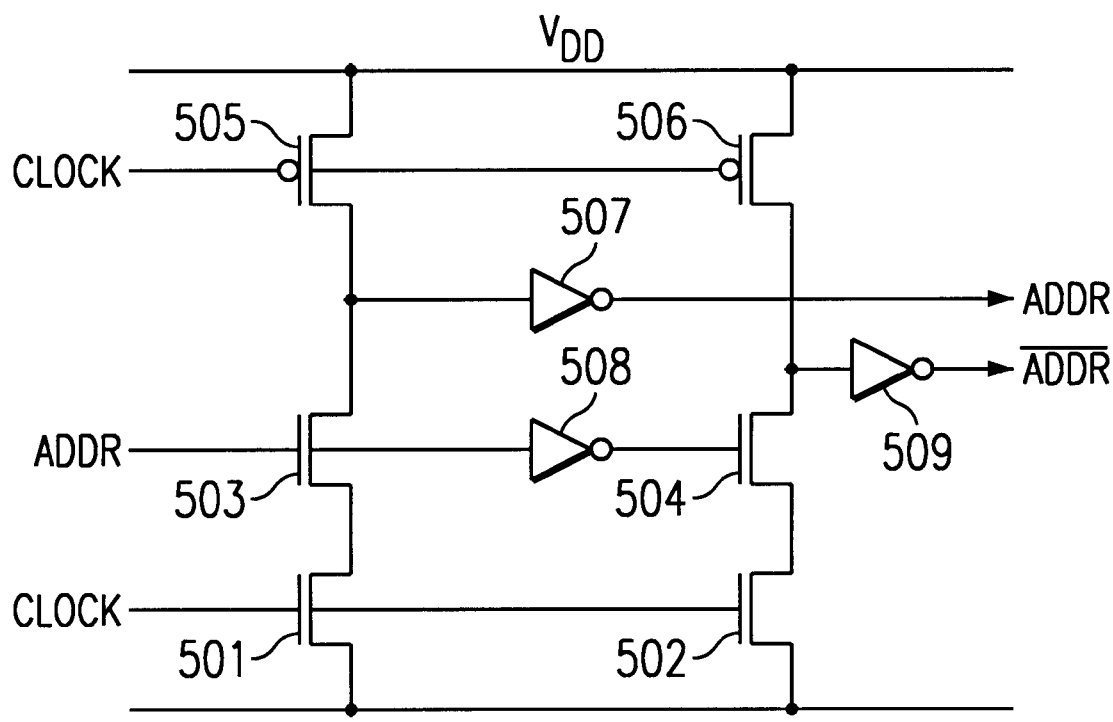
FIG. 5 illustrates an address generation circuit with precharged dynamic implementation.

FIG. 5 illustrates a dynamic precharge address generation circuit suitable for use with the match circuit illustrated in FIG. 3. Note this is merely a convenient design example for producing these signals and other circuits are feasible. The match circuit includes a series connection from voltage supply $V_{DD}$ through the source-drain path of P-channel transistor 505, first intermediate node 511, the source-drain path of N-channel transistor 503, second intermediate node 512 and the source-drain path of N-channel transistor 501 to ground. The match circuit includes another series connection from voltage supply $V_{DD}$ through the source-drain path of P-channel transistor 506, third intermediate node 513, the source-drain path of N-channel transistor 504, fourth intermediate node 514 and the source-drain path of N-channel transistor 502 to ground. Inverter 507 has an input connected to first intermediate node 511 and an output producing the signal addr. Inverter 508 has and input receiving the incoming ADDR signal and an output connected to the gate of N-channel transistor 504. Inverter 509 has an input connected to third intermediate node and an output producing the inverse signal $\overline{addr}$. The clock signal is applied to the gates of N-channel transistors 501 and 502 and P-channel transistors 505 and 506. The incoming address bit ADDR is applied to the gate of N-channel transistor 503. Double inversion through transistor 503 and inverter 507 produces the addr signal in-phase with ADDR. The triple inversion through inverter 508, N-channel transistor 504 and inverter 509 produces the out-of-phase or inverse signal $\overline{addr}$.

The circuit operation will be described in conjunction with FIG. 6. When clock is "low", P-channel transistors 505 and 506 are "on" and N-channel transistors 501 and 502 are "off". P-channel transistor 505 supplies a "high" signal to the input of inverter 507, causing the addr signal to be "low". Similarly, P-channel transistor 506 supplies a "high" signal to the input of inverter 509, causing theaddr signal to also be "low". This produces the desired "low" for both addr and $\overline{addr}$ signals when clock is "low." As previously described, this state precharges the nodes $z_{i,j}$. Note that when the clock is "low", P-channel transistors 505 and 506 precharge the nodes at the inputs of inverters 507 and 509.

Figure 6:
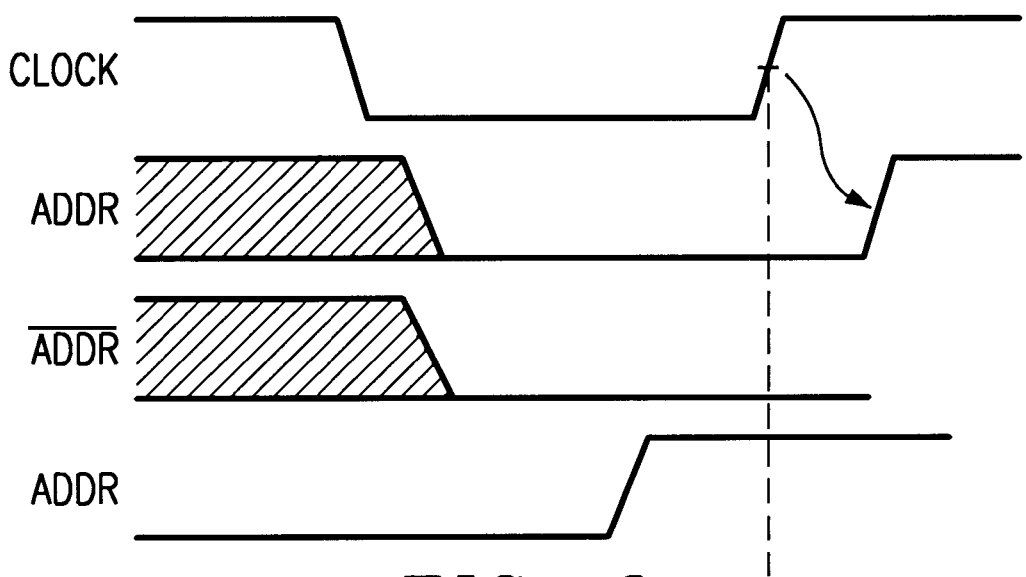
FIG. 6 illustrates waveforms depicting generation of signals addr and $\overline{\text{addr}}$.

When clock is "high", the circuit of FIG. 6 produces the true/complement version of signals addr and $\overline{addr}$. When the clock signal is "high", both N-channel transistors 501 and 502 are turned "on". In the example shown in FIG. 6, ADDR is "high" when clock goes "high". The input to inverter 507 is pulled "low" via N-channel transistors 503 and 501. Thus inverter 507 produces the addr signal in-phase with ADDR. At the same time, inverter 508 supplies a "low" input to the gate of N-channel transistor 504, thereby turning this transistor "off". The input to inverter 509 is "high" due to the precharge when clock was "low". Thus inverter 509 goes "low", producing the inverse signal $\overline{addr}$ out of phase with the input signal ADDR. Not shown in FIG. 6 is the case when ADDR is "low" when clock goes "high". N-channel transistor 503 is turned "off", thus the input to inverter 507 is "high" due to the precharge when clock was "low". Thus the signal addr is "low" in phase with the input signal ADDR. At the same time, inverter 508 supplies a "high" input to the gate of N-channel transistor 504, thereby turning this transistor "on". The node at the input of inverter 509 is pulled "low" via N-channel transistors 504 and 502. Thus inverter 509 goes "high", producing the inverse signaladdr out of phase with the input signal ADDR.

Although the preferred embodiment has been described in detail, it should be understood that various changes, substitutions and alterations can be made therein without departing from the spirit and scope of the invention as defined by the appended claims.

What is claimed is:

1. A content addressable memory match circuit for detecting a match between a supplied data, bit and a stored data bit comprising:

a data latch storing said stored data bit therein having a first output terminal producing a true bit signal and a second output terminal producing an inverse bit signal;

a match precharge node;

a source of precharge voltage;

a precharge device connected to said match precharge node and said source of said precharge voltage during a precharge time;

a conditional discharge device connected to said data latch and said match precharge node and receiving a supplied data bit signal, said conditional discharge device conditionally discharging said match precharge node during an evaluate time dependent on whether said stored data bit in said data latch matches said supplied data bit signal, said conditional discharge device including a first series connection of a first transistor and a second transistor having serially connected source-drain paths connected between said match precharge node and a source of a second voltage other than said precharge voltage, said first transistor having a gate connected to said first output terminal of said data latch thus receiving said true data signal and said second transistor having a gate receiving an inverse of said supplied data bit signal, and a second series connection of a third transistor and a fourth transistor having serially connected source-drain paths connected between said match precharge node and said source of said second voltage other than said precharge voltage, said third transistor having a gate connected to said second output terminal of said data latch thus receiving said inverse data signal and said fourth transistor having a gate receiving said supplied data bit signal, whereby said precharge node is not discharged if said stored data bit in said data latch matches said supplied data bit signal.

2. The content addressable memory match circuit of claim 1, further comprising:

a valid latch storing a valid bit therein indicating whether data stored in a corresponding said data latch is to be compared with said supplied data bit signal having an output terminal producing a valid signal;

a fifth transistor having a source-drain path between both said first series connection and said second series connection and said source of said second voltage, thereby forming a part of said connection of both said first series connection and said second series connection between said match precharge node and said second voltage, said fifth transistor having a gate connected to said output terminal of said valid latch thus receiving said valid signal, whereby said match precharge node is not discharged if said valid bit stored in said valid latch indicates data is not to be compared with said supplied data bit signal.

3. The content addressable memory match circuit of claim 2, wherein:

said first and third transistors are constructed having a first threshold voltage; and said second, fourth and fifth transistors are constructed having a second threshold voltage lower than said first threshold voltage.

4. The content addressable memory match circuit of claim 2, wherein:

said second and fourth transistors are constructed having a first threshold voltage; and said first, third and fifth transistors are constructed having a second threshold voltage lower than said first threshold voltage.

5. The content addressable memory match circuit of claim 2, wherein:

said fifth transistor is constructed having a first threshold voltage; and said first, second, third and fourth transistors are constructed having a second threshold voltage lower than said first threshold voltage.

6. The content addressable memory match circuit of claim 1, wherein:

said precharge device includes a third series connection of a sixth transistor and a seventh transistor having serially connected source-drain paths connected between said precharge node and said first and second series connections, said sixth transistor having a gate receiving said supplied data bit, and said seventh transistor having a gate receiving said inverse of said supplied data bit, said sixth and seventh transistors being constructed of a second conductivity type opposite to said first conductivity type; and a match drive circuit receiving an incoming data signal input, said match drive signal (1) generating said supplied data bit signal and said inverse supplied data bit signal having an identical digital state during said precharge time, said identical digital state causing said sixth and seventh transistors not to conduct, and (2) generating said supplied data bit signal having a digital state equal to a digital state of said incoming data signal input and said inverse supplied data bit signal having a digital signal opposite to said digital state of said incoming data signal input during said evaluate time.

7. The content addressable memory, match circuit of claim 6, wherein:

said first, second, third and fourth transistors are constructed of a first conductivity type; and said sixth and seventh transistors are constructed of a second conductivity type opposite to said first conductivity type.

8. The content addressable memory match circuit of claim 7, wherein:

said first, second, third and fourth transistors are constructed of a N-channel conductivity type; and said sixth and seventh transistors are constructed of a P-channel conductivity type.

9. The content addressable memory match circuit of claim 6, wherein:

said match drive circuit includes a power supply voltage source;

a ground node, a fourth series connection comprising an eighth transistor of a first conductivity type having a source-drain path connected between said power supply voltage source and a first intermediate node and having a gate receiving a clock signal, a ninth transistor of a second conductivity type opposite to said first conductivity type having a source-drain path connected between said first intermediate node and a second intermediate node and a gate receiving said incoming data signal input, and a tenth transistor of said second conductivity type having a source-drain path connected between said second intermediate node and said ground node an having a gate receiving said clock signal, a first inverter having an input connected to said first intermediate node and an output generating said supplied data bit signal, a second inverter having an input receiving said incoming data signal input and an output, a fifth series connection comprising an eleventh transistor of said first conductivity type having a source-drain path connected between said power supply voltage source and a third intermediate node and having a gate receiving said clock signal, a twelfth transistor of said second conductivity type having a source-drain path connected between said third intermediate node and a fourth intermediate node and a gate connected to said output of said second inverter, and a thirteenth transistor of said second conductivity type having a source-drain path connected between said fourth intermediate node and said ground node an having a gate receiving said clock signal, and a third inverter having an input connected to said third intermediate node and an output generating said inverse supplied data bit signal;

whereby said supplied data bit signal and said inverse supplied data bit signal are held in a precharge state if the said clock signal has a first digital state, and said supplied data bit signal and inverse supplied data bit signal have complementary states when said clock signal has a second digital state opposite to said first digital state.

* * * * *